(12) United States Patent
Fukui

(10) Patent No.: US 8,847,591 B2
(45) Date of Patent: Sep. 30, 2014

(54) CURRENT SENSOR

(75) Inventor: Hirofumi Fukui, Miyagi-ken (JP)

(73) Assignee: ALPS Green Devices Co., Ltd., Tokyo (JP)

( * ) Notice: Subject to any disclaimer, the term of this patent is extended or adjusted under 35 U.S.C. 154(b) by 204 days.

(21) Appl. No.: 13/553,672

(22) Filed: Jul. 19, 2012

(65) Prior Publication Data

US 2013/0082698 A1  Apr. 4, 2013

(30) Foreign Application Priority Data

Sep. 29, 2011  (JP) .................................. 2011-214371

(51) Int. Cl.
*G01R 33/02* (2006.01)
*G01R 33/09* (2006.01)
*G01R 15/20* (2006.01)
*G01R 31/00* (2006.01)

(52) U.S. Cl.
CPC .............. *G01R 15/205* (2013.01); *G01R 33/09* (2013.01); *G01R 31/006* (2013.01); *G01R 33/091* (2013.01)
USPC .......................................................... 324/252

(58) Field of Classification Search
CPC .............................. B82Y 25/00; G01R 33/093
USPC .......................................................... 324/252
See application file for complete search history.

(56) References Cited

U.S. PATENT DOCUMENTS

2006/0071655 A1   4/2006  Shoji
2010/0315928 A1  12/2010  Zhou et al.

*Primary Examiner* — Reena Aurora
(74) *Attorney, Agent, or Firm* — Beyer Law Group LLP

(57) ABSTRACT

A current sensor includes a magnetic sensor including magnetoresistive sensors configured to detect induction fields generated by a measurement current passing through a current line, a magnetic field application unit configured to apply to the magnetoresistive sensors a magnetic field having a direction perpendicular to sensitivity directions of the magnetoresistive sensors; and a computing unit configured to calculate from an output of the magnetic sensor a compensation value for the output. The computing unit is configured to be capable of calculating the compensation value from the outputs of the magnetic sensor obtained in at least two states in which magnetic fields applied by the magnetic field application unit are different from each other.

6 Claims, 9 Drawing Sheets

CURRENT SENSOR

CLAIM OF PRIORITY

This application claims benefit of Japanese Patent Application No. 2011-214371 filed on Sep. 29, 2011, which is hereby incorporated by reference.

BACKGROUND OF THE INVENTION

1. Field of the Invention

The present invention relates to current sensors capable of measuring a current to be measured in a non-contact manner.

2. Description of the Related Art

Known current sensors in the areas of electric cars, solar batteries, and the like include a current sensor in which an induction field generated by a measurement current is detected using a magnetoresistive sensor, which is a magnetic sensor (refer to US2006/071655A1, for example). In a current sensor disclosed in US2006/071655A1, a high sensitivity is realized by detecting a measurement current on the basis of differences among a plurality of the outputs of magnetoresistive sensors.

In such a current sensor, since the magnetic field detection sensitivity of a magnetoresistive sensor directly affects the accuracy of current measurement, it is important to appropriately manage the magnetic field detection sensitivity of the magnetoresistive sensor to maintain a high current measurement accuracy of the current sensor. Regarding this point, a method of compensating a magnetic sensor output on the basis of the resistance of a magnetic sensor in a specific environment has been proposed to compensate for a change in resistance due to aging of the magnetic sensor (refer to US2010/315928A1, for example).

SUMMARY OF THE INVENTION

A magnetoresistive sensor, which has predetermined temperature characteristics, has a resistance that varies because of variations in temperature. Hence, when the temperature of the operating environment varies with continued use of a current sensor, the sensitivity of the current sensor may vary, resulting in a decrease in the accuracy of current measurement. To maintain high accuracy of current measurement in a current sensor, appropriate management of the magnetic field detection sensitivity in current measurement is required. However, a current sensor that allows management of magnetic field detection sensitivity to be performed at the time of current measurement has not been proposed.

In view of the above-described points, the present invention provides a current sensor that allows appropriate management of magnetic field detection sensitivity to be performed even at the time of current measurement.

A current sensor of the present invention includes: a magnetic sensor including a magnetoresistive sensor configured to detect an induction field generated by a measurement current passing through a current line; a magnetic field application unit configured to apply to the magnetoresistive sensor a magnetic field having a direction perpendicular to a sensitivity direction of the magnetoresistive sensor; and a computing unit configured to calculate from an output of the magnetic sensor a compensation value for the output. The computing unit is configured to be capable of calculating the compensation value from the outputs of the magnetic sensor obtained in at least two states in which magnetic fields applied by the magnetic field application unit are different from each other.

With this configuration, since the compensation value for the magnetic sensor is calculated by applying a magnetic field having a direction perpendicular to the sensitivity direction of the manetoresitive sensor, the compensation value can be calculated even at the time of current measurement. As a result, a current sensor that allows appropriate management of magnetic field detection sensitivity to be performed even at the time of current measurement is realized.

In the current sensor of the present invention, the two states are preferably a state in which a magnetic field is not applied by the magnetic field application unit and a state in which a predetermined magnetic field is applied by the magnetic field application unit. With this configuration, the compensation value can be calculated using the output of the magnetic sensor in a state in which a magnetic field having a direction perpendicular to the sensitivity direction is not applied and the output of the magnetic sensor in a state in which a magnetic field having a direction perpendicular to the sensitivity direction is applied.

In the current sensor of the present invention, the two states are preferably a state in which a first magnetic field is applied by the magnetic field application unit and a state in which a second magnetic field is applied by the magnetic field application unit. With this configuration, the compensation value can be calculated using the output of the magnetic sensor in a state in which a first magnetic field having a direction perpendicular to the sensitivity direction is applied and the output of the magnetic sensor in a state in which a second magnetic field having a direction perpendicular to the sensitivity direction is applied.

In the current sensor of the present invention, the computing unit is preferably configured to be capable of calculating an offset $\beta$ used as the compensation value from Equation (3), where $\alpha$ is a rate of change of sensitivity of the magnetic sensor between the two states, and O1 and O2 are the outputs of the magnetic sensor obtained in the two states. With this configuration, an offset $\beta$ of the magnetic sensor used as the compensation value can be calculated.

$$\beta = (\alpha O1 - O2)/(\alpha - 1) \tag{3}$$

In the current sensor of the present invention, the current sensor is preferably configured to be capable of calculating an output of the current sensor by subtracting the compensation value from an output of the magnetic sensor. With this configuration, the accuracy of current measurement of the current sensor can be increased by subtracting the compensation value from an output of the magnetic sensor.

DESCRIPTION OF THE PREFERRED EMBODIMENTS

The inventor has found that the magnetic field detection sensitivity of a magnetoresistive sensor changes when a magnetic field is applied to the magnetoresistive sensor in a direction perpendicular to the sensitivity direction of the magnetoresistive sensor. The inventor has also found that when the magnetic field detection sensitivity of a magnetoresistive sensor is changed using this method, the offset of the output characteristic of a magnetic sensor including the magnetoresistive sensor is negligibly changed although the steepness of the curve of the characteristic changes.

Figure 1:
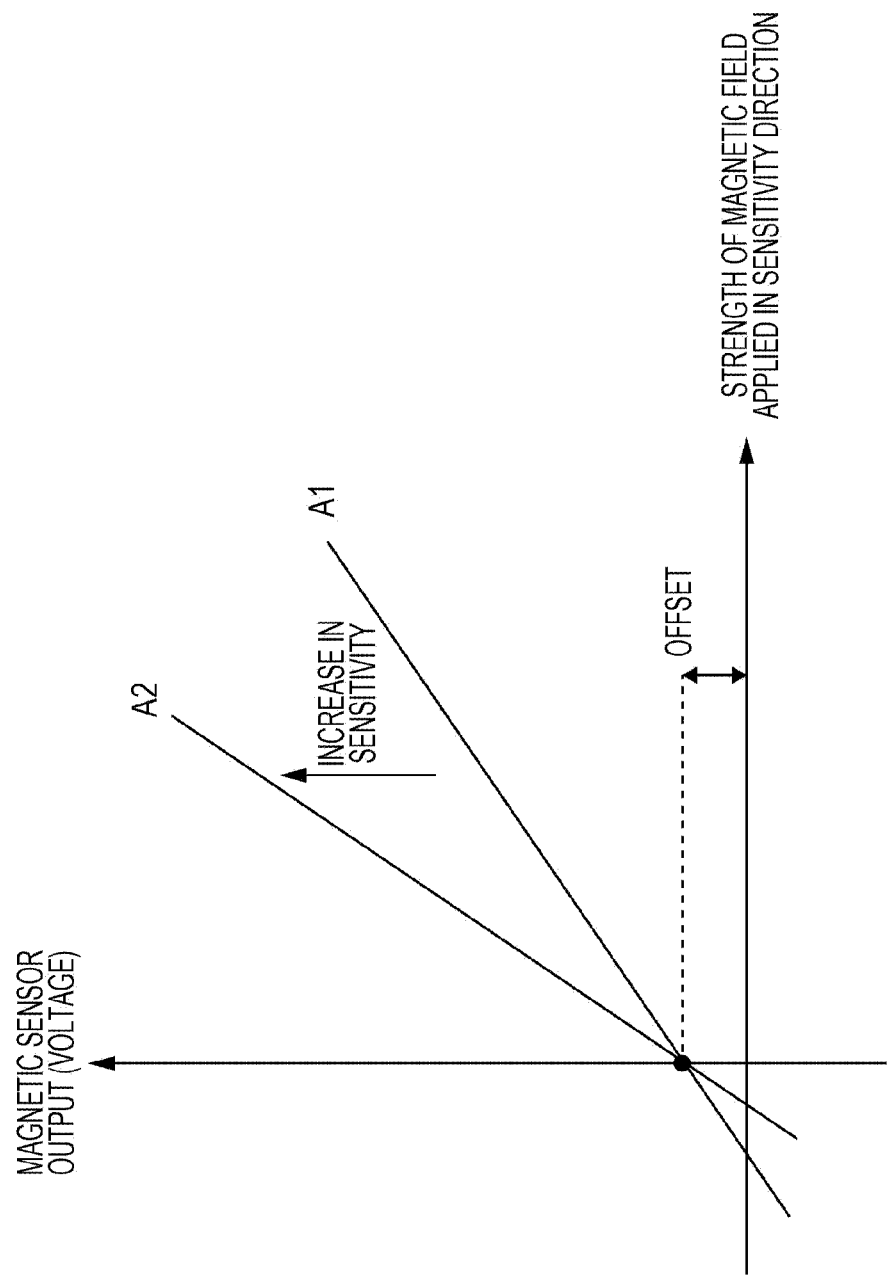
FIG. 1 is an output characteristic diagram of a magnetic sensor for the case in which a magnetic field in a direction perpendicular to a sensitivity direction is applied and the case in which a magnetic field in a direction perpendicular to a sensitivity direction is not applied.

FIG. 1 is an output characteristic diagram of a magnetic sensor for the case in which a magnetic field in a direction perpendicular to the sensitivity direction (hereinafter called a perpendicular magnetic field) is applied and the case in which a perpendicular magnetic field is not applied. Referring to FIG. 1, the horizontal axis represents the strength of a magnetic field applied in the sensitivity direction and the vertical axis represents the output of the magnetic sensor. Here, the output characteristic at the time when a perpendicular magnetic field is not applied is denoted by A1 and the output characteristic at the time when a perpendicular magnetic field is applied is denoted by A2. In this case, when a perpendicular magnetic field is applied, the output (vertical axis) of the magnetic sensor increases (A1→A2) while a constant magnetic field is being applied in the sensitivity direction. On the other hand, when a magnetic field is not applied in the sensitivity direction, the output (offset) of the magnetic sensor does not depend on whether or not a perpendicular magnetic field exists. In other words, the offsets in A1 and A2 are substantially the same.

On the basis of the above-described findings, the inventor found that the offset can be calculated by obtaining at least two output characteristics (for example, A1 and A2) for a constant magnetic field in the sensitivity direction. The present invention has been completed by utilizing the idea that the offset can be compensated for at any time by providing a configuration in which a perpendicular magnetic field can be applied in a plurality of states. In other words, the present invention is based on a technical idea that the offset is calculated from the outputs of a magnetic sensor in two states by creating at least two states with different perpendicular magnetic fields.

It is necessary to create two states with different perpendicular magnetic fields to realize the technical idea described above. Hence, a current sensor of the present invention includes a configuration in which a perpendicular magnetic field is applied to a magnetoresistive sensor. With this configuration, the following two states may be realized: a first state in which a perpendicular magnetic field is applied and a second state in which a perpendicular magnetic field is not applied. Alternatively, this configuration may realize the following two states: a first state in which a perpendicular magnetic field with a predetermined direction and a predetermined strength is applied and a second state in which a perpendicular magnetic field whose direction or strength is different from that of the first state is applied. This current sensor allows the offset in the magnetic sensor output to be compensated for at any appropriate time. Hereinafter, the current sensor of the present invention will be described with reference to the attached drawings.

First Embodiment

Figure 2:
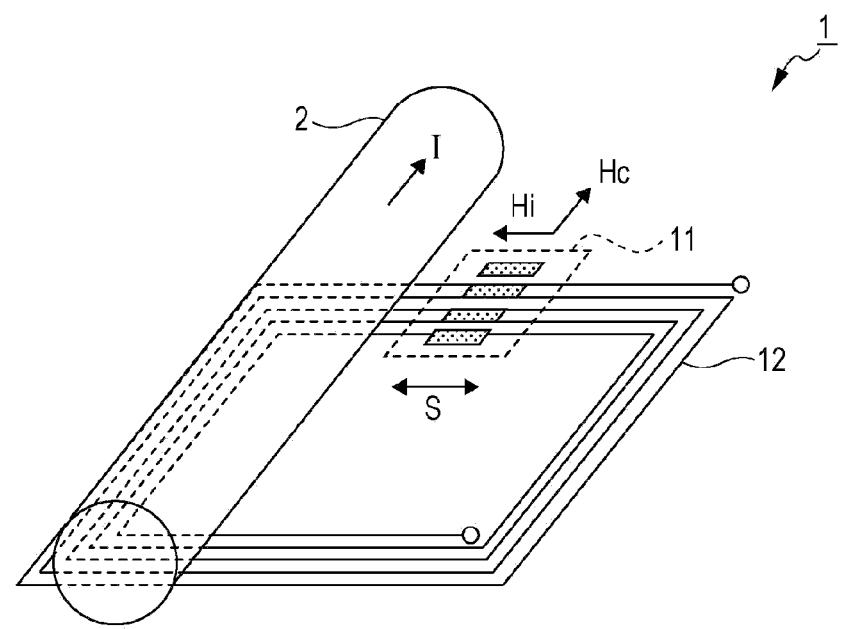
FIG. 2 is a perspective view illustrating an example arrangement of a current sensor and its peripheral configuration according to a first embodiment.
Figure 3:
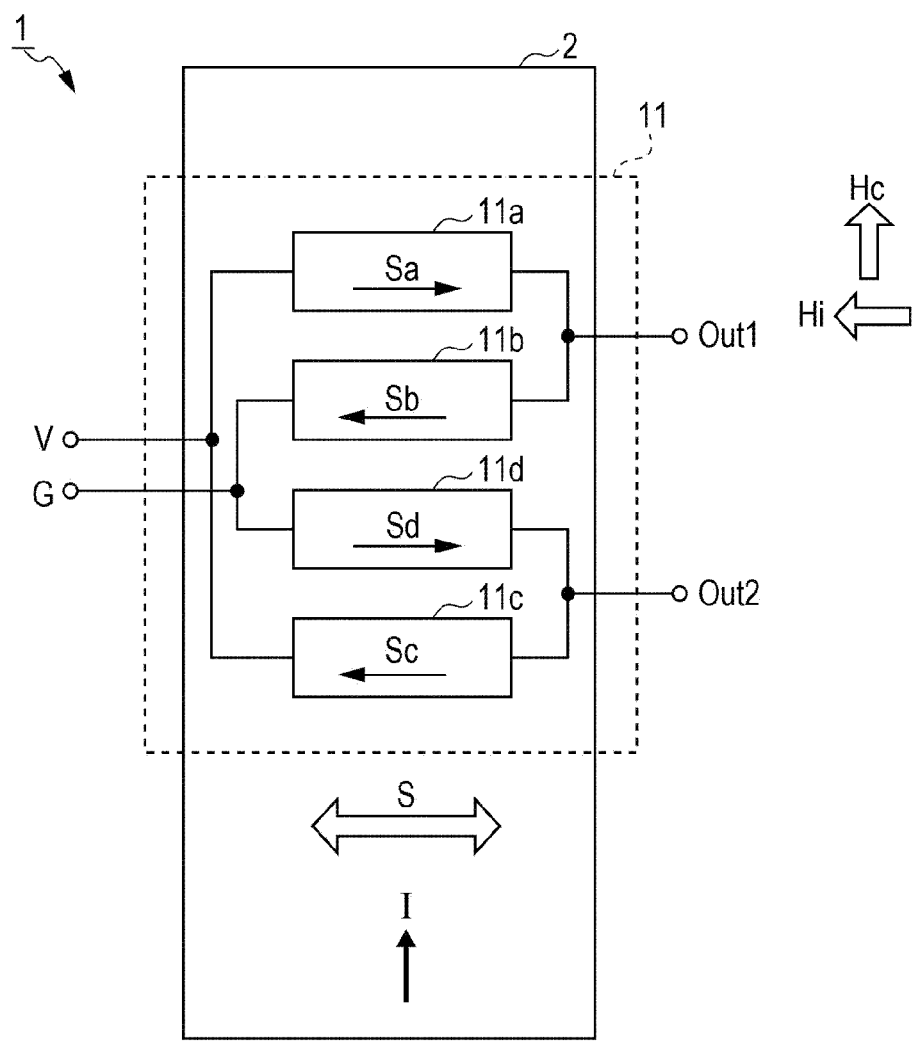
FIG. 3 is a plan view illustrating an example arrangement of a current sensor and its peripheral configuration according to a first embodiment.

FIG. 2 and FIG. 3 are schematic diagrams illustrating example configurations of a current sensor according to the present embodiment. A current sensor 1 illustrated in FIG. 2 and FIG. 3 is a magnetic proportional current sensor, and is arranged near a current line 2 through which a measurement current I flows in the direction in which the current line 2 extends (y-direction).

The current sensor 1 illustrated in FIG. 2 and FIG. 3 includes a magnetic sensor 11 that detects an induction field Hi generated by the measurement current I flowing through the current line 2 and a coil (magnetic field application unit) 12 that can apply an induction field Hc with a predetermined direction to the magnetic sensor 11. In FIG. 3, the coil 12 is omitted for simplicity.

Referring to FIG. 3, the magnetic sensor 11 is formed of a bridge circuit that includes four magnetoresistive sensors 11a to 11d. Sensitivity directions (sensitivity axis directions) Sa to Sd of the magnetoresistive sensors 11a to 11d are a direction (x direction) substantially perpendicular to the direction (y direction) in which the current line 2 extends. Hence, a sensitivity direction S of the magnetic sensor 11 is the x direction similarly to the sensitivity directions Sa to Sd. As a result, the magnetic sensor 11 can detect the induction field Hi in the x direction generated by the measurement current I.

Referring to FIG. 3, first ends of the magnetoresistive sensors 11a and 11c are connected to a power supply terminal V, whereby a power supply voltage (Vdd) is applied to the magnetoresistive sensors 11a and 11c. First ends of the magnetoresistive sensors 11b and 11d are connected to a ground terminal G, whereby a ground voltage (GND) is applied to the magnetoresistive sensors 11b and 11d. The second ends of the magnetoresistive sensors 11a and 11b are connected to an output terminal Out1. The second ends of the magnetoresistive sensors 11c and 11d are connected to an output terminal Out2. As a result, voltages corresponding to the resistances of the magnetoresistive sensors 11a to 11d are generated at the output terminals Out1 and Out2, whereby a voltage difference corresponding to the induction field Hi is obtained. The voltage difference between the output terminals Out1 and Out2 corresponds to the output of the magnetic sensor 11.

As described above, the high-sensitivity magnetic sensor 11 is realized by forming a bridge circuit using the magnetoresistive sensors 11a to 11d. Note that the magnetic sensor 11 need not be a bridge circuit formed of four sensors. For example, a half bridge circuit formed of two sensors may be used. Further, the number of magnetoresistive sensors used in the magnetic sensor 11 may be appropriately changed. For example, a full bridge circuit may be formed by combining one to three magnetoresistive sensors and any number of fixed resistance elements.

The coil 12 is configured to be capable of applying the induction field Hc in a direction (y-direction) substantially perpendicular to the sensitivity directions Sa to Sd of the magnetoresistive sensors 11a to 11d. In other words, the coil 12 is configured to be capable of applying to the magnetic sensor 11 the induction field Hc in a direction (y-direction) substantially perpendicular to the sensitivity direction S. By applying to the magnetic sensor 11 the induction field Hc in a direction substantially perpendicular to the sensitivity direction S as described above, the sensitivity characteristic of the magnetic sensor 11 can be changed. By utilizing this fact, the offset that varies with temperature can be compensated for at any time, as described later.

Note that the coil 12 is not limited to the spiral planar coil illustrated in FIG. 2. The form of the coil 12 may be set to any form that enables application of the induction field Hc that is substantially perpendicular to the sensitivity direction S. Note also that a spiral planar coil, which can be integrated together with a magnetoresistive sensor into one unit, has an advantage particularly in terms of a reduction in the number of components and a reduction in size.

Figure 4:
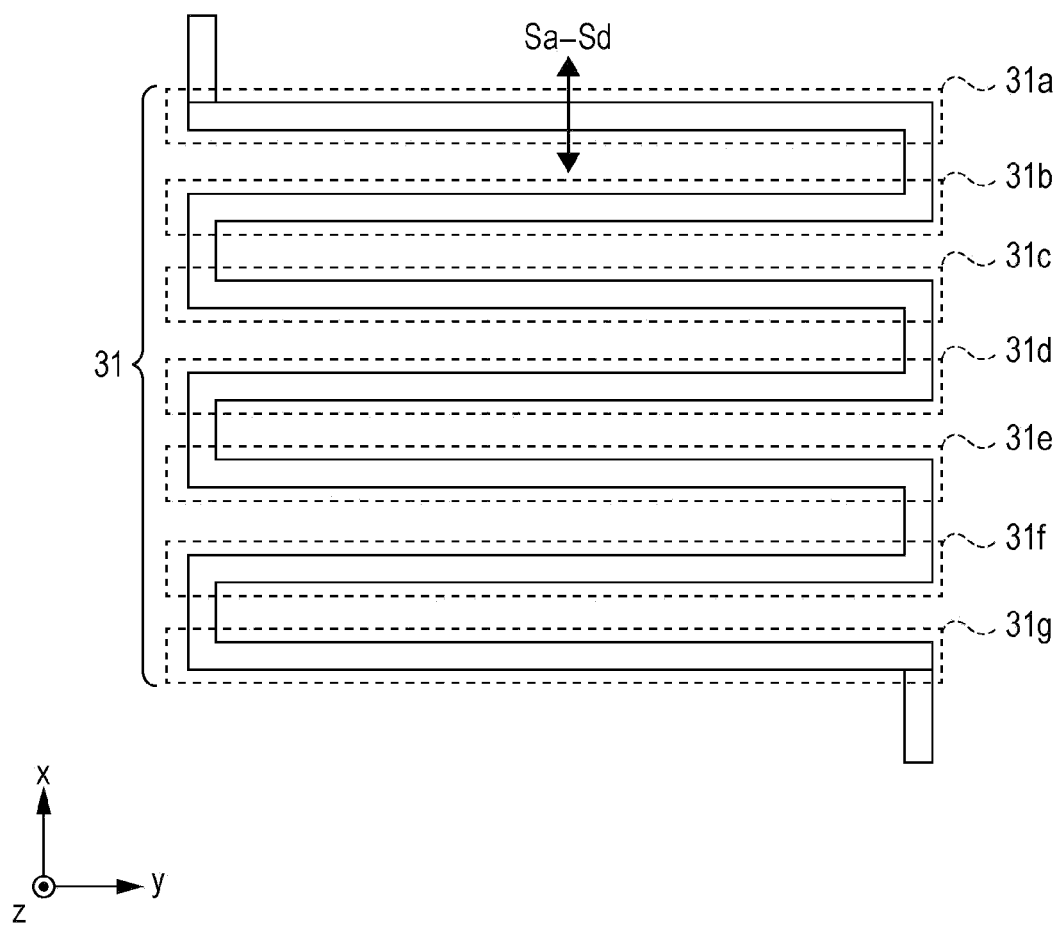
FIG. 4 is a schematic plan view illustrating an example configuration of a GMR device used as a magnetoresistive sensor.

FIG. 4 is a schematic plan view of a giant magnetoresistance (GMR) device used as each of the magnetoresistive sensors 11a to 11d. Referring to FIG. 4, a GMR device is formed of a magnetic detection pattern 31 that includes a plurality of long patterns 31a to 31g arranged in a direction (x direction) perpendicular to the longitudinal direction thereof (y direction). The long patterns are arranged in such a manner as to be substantially parallel with and serially connected to one another, where the ends of the long patterns are connected to the respective ends of the neighboring long patterns. As a result, the magnetic detection pattern 31 has a meandering shape.

Referring to FIG. 4, the sensitivity directions (sensitivity axis directions) Sa to Sd of the device are a direction (x direction) perpendicular to the longitudinal direction of the long patterns 31a to 31g. Although the magnetic detection pattern 31 including the seven long patterns 31a to 31g is illustrated in FIG. 4, the number of the long patterns that form the magnetic detection pattern 31 is not limited to this. Further, a hard bias layer that applies a bias magnetic field parallel with the longitudinal direction of the long patterns 31a to 31g to a free magnetic layer (soft magnetic free layer) that forms the magnetic detection pattern 31 may be provided. By providing the hard bias layer, the magnetization directions of the free magnetic layer can be made to be the same and, hence, the linearity between the resistance value and an external magnetic field strength can be increased.

Figure 5:
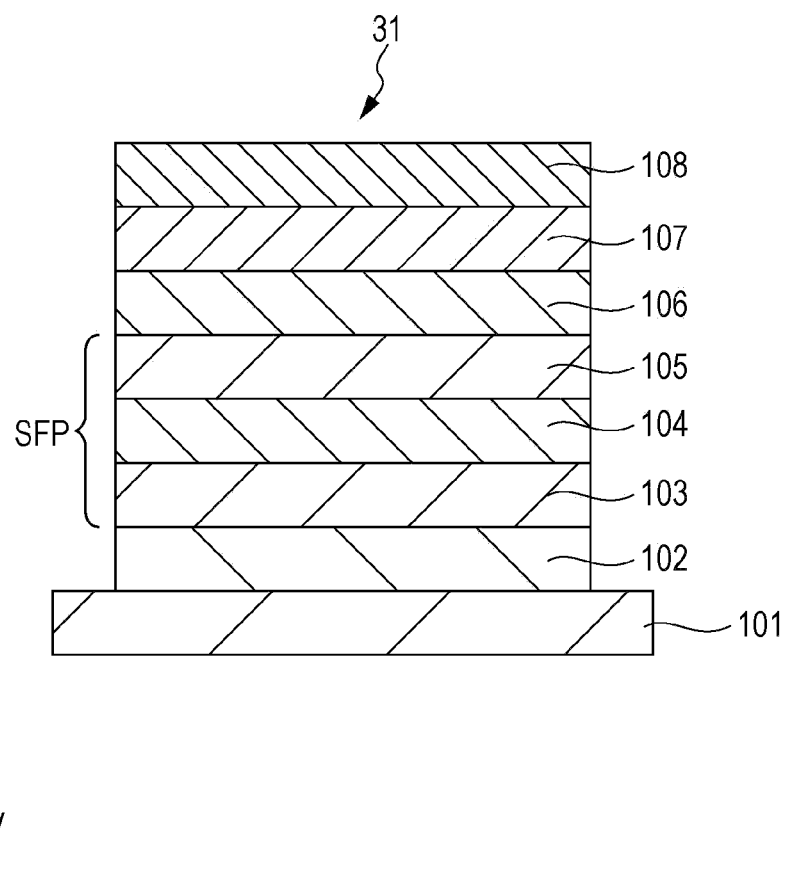
FIG. 5 is a schematic sectional view illustrating an example configuration of a GMR device used as a magnetoresistive sensor.

FIG. 5 is a schematic sectional diagram illustrating an example configuration of a GMR device used as each of the magnetoresistive sensors 11a to 11d. Referring to FIG. 5, a GMR device has a multilayer structure that forms the magnetic detection pattern 31 provided on a substrate 101. The magnetic detection pattern 31 includes a seed layer 102, a first ferromagnetic layer 103, an anti-parallel coupling layer 104, a second ferromagnetic layer 105, a non-magnetic intermediate layer 106, a free magnetic layer 107, and a protection layer 108. The first ferromagnetic layer 103 and the second ferromagnetic layer 105 are anti-ferromagnetically coupled to each other through the anti-parallel coupling layer 104, thereby forming a self-pinned ferromagnetic layer (synthetic ferri pinned (SFP) layer).

As described above, when the induction field Hc in a direction (y direction) substantially perpendicular to the sensitivity directions Sa to Sd is applied by the coil 12, the magnetization direction of the free magnetic layer 107 is changed by the induction field Hc. As a result, the resistance values of the magnetoresistive sensors 11a to 11d change, whereby the sensitivity of the magnetic sensor 11 increases or decreases.

The output characteristics of the magnetic sensor 11 in the case where the induction field Hc is applied by the coil 12 and the case where the induction field Hc is not applied are illustrated in FIG. 1. In other words, the output characteristic of the magnetic sensor 11 in the case where the induction field Hc is not applied by the coil 12 is the characteristic A1. On the other hand, in the case where the induction field Hc is applied by the coil 12, the sensitivity of the magnetic sensor 11 is increased and the output characteristic becomes the characteristic A2.

As illustrated in FIG. 1, the sensitivity of the magnetic sensor 11 is changed when the induction field Hc substantially perpendicular to the sensitivity direction S is applied by the coil 12. This is because the magnetization direction of the free magnetic layer that forms the magnetoresistive sensors 11a to 11d is changed when a magnetic field perpendicular to the sensitivity directions Sa to Sd of the magnetoresistive sensors 11a to 11d is applied. On the other hand, in this case, the offset of the output of the magnetic sensor 11 does not change. By utilizing this fact, it is possible to calculate a compensation value for compensating for the offset and to compensate the output of the magnetic sensor 11 using this compensation value.

For example, it is assumed that the output characteristic A1 illustrated in FIG. 1 is expressed by Equation (1).

$$O_1 = f(H) + \beta \qquad (1)$$

Here, $O_1$ is the output of the magnetic sensor 11 in the case where the induction field Hc is not applied, f(H) is a function that is proportional to the strength of a magnetic field H applied in the sensitivity direction, and $\beta$ is an offset in the output of the magnetic sensor 11.

It is assumed that the output characteristic A2 illustrated in FIG. 1 is expressed by Equation (2).

$$O_2 = \alpha f(H) + \beta \qquad (2)$$

Here, $O_2$ is the output of the magnetic sensor 11 in the case where the induction field Hc is applied, f(H) is a function that is proportional to the strength of a magnetic field H applied in the sensitivity direction, a is the rate of change of sensitivity at the time when the induction field is changed from zero to Hc, and $\beta$ is an offset in the output of the magnetic sensor 11.

From Equations (1) and (2), the offset $\beta$ can be given by the following Equation (3).

$$\beta = (\alpha O_1 - O_2)/(\alpha - 1) \qquad (3)$$

The rate of change of sensitivity a for the change from A1 to A2 is dependent on the difference between a magnetic field (perpendicular magnetic field) which is applied in A1 and perpendicular to the sensitivity direction and a perpendicular magnetic field applied in A2. Since the perpendicular magnetic field in A1 is preferably zero and the perpendicular magnetic field in A2 is Hc, the rate of change of sensitivity $\alpha$ is dependent only on the strength of Hc. This means that the rate of change of sensitivity $\alpha$ can be thought to be a constant when the induction field Hc applied to the magnetic sensor 11 has been determined in advance. In other words, by obtaining the rate of change of sensitivity $\alpha$ in advance under the condition that the induction field Hc is applied, the offset can be calculated using Equation (3) described above by applying the induction field Hc at a desired time and detecting the outputs of the magnetic sensor 11 before and after that time. Note that it is assumed that the strengths of the magnetic field H (i.e., the measurement current I and the induction field Hi generated by the measurement current I) applied in the sensitivity direction before and after obtaining the output O1 and the output O2 are the same.

Figure 6:
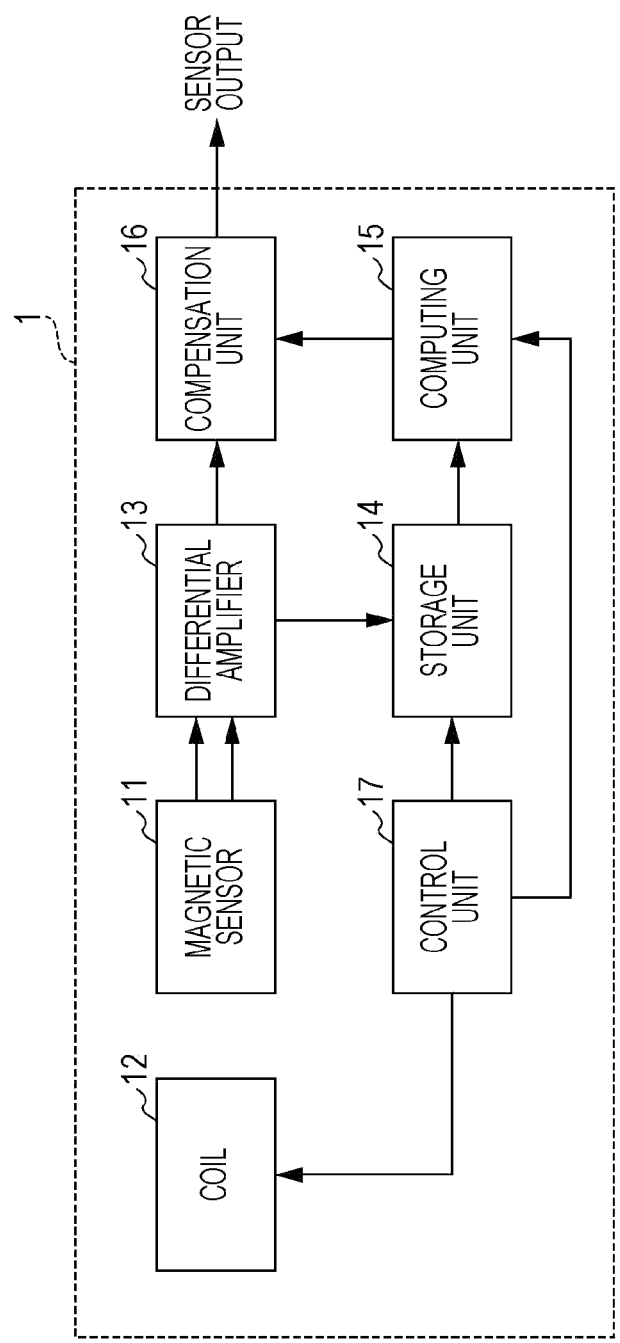
FIG. 6 is a block diagram illustrating a circuit configuration of the current sensor according to the first embodiment.

FIG. 6 is a block diagram illustrating a circuit configuration of the current sensor 1 according to the present invention. Referring to FIG. 6, the current sensor 1 includes, in addition to the magnetic sensor 11 and the coil 12, a differential amplifier 13 that calculates a voltage difference based on the outputs of the magnetic sensor 11, a storage unit 14 for storing the output of the differential amplifier 13, a computing unit 15 that calculates a compensation value on the basis of the output of the differential amplifier 13 stored in the storage unit 14, and a compensation unit 16 that compensates the output of the differential amplifier 13 using the compensation value calculated by the computing unit 15. Further, the current sensor 1 includes a control unit 17 that controls the operations of the coil 12, the storage unit 14, the computing unit 15, and the like.

The differential amplifier 13 calculates a voltage difference based on the outputs of the magnetic sensor 11 using the output voltages (O1, O2) of the two output terminals Out1 and Out2 of the magnetic sensor 11. The calculated voltage difference is transmitted to the storage unit 14 and the compensation unit 16. Note that the differential amplifier 13 may include a function of amplifying the voltage difference of the magnetic sensor 11. The storage unit 14 stores the output of the differential amplifier 13 in accordance with a command from the control unit 17. Specifically, the storage unit 14 stores the output of the differential amplifier 13 before and after the coil 12 generates the induction field Hc, for example. In addition, the storage unit 14 stores a rate of change of sensitivity and the like measured in advance. The computing unit 15 calculates a compensation value on the basis of the content stored in the storage unit 14. In other words, the computing unit 15 calculates a compensation value using the output of the differential amplifier 13 (corresponding to the outputs of the magnetic sensor 11) obtained before and after a given time and a rate of change of sensitivity. The compensation value can be calculated using Equation (3) described above.

The compensation unit 16 compensates the output of the differential amplifier 13 (corresponding to the outputs of the magnetic sensor 11) using the compensation value calculated by the computing unit 15, and outputs the compensated output of the magnetic sensor 11 as the output of the current sensor 1. In other words, after the compensation value has been determined by the computing unit 15, the compensation unit 16 removes the influence of the offset preferably by subtracting the compensation value from the output of the magnetic sensor 11. The control unit 17 provides various commands to the coil 12, the storage unit 14, the computing unit 15, and the like.

Figure 7:
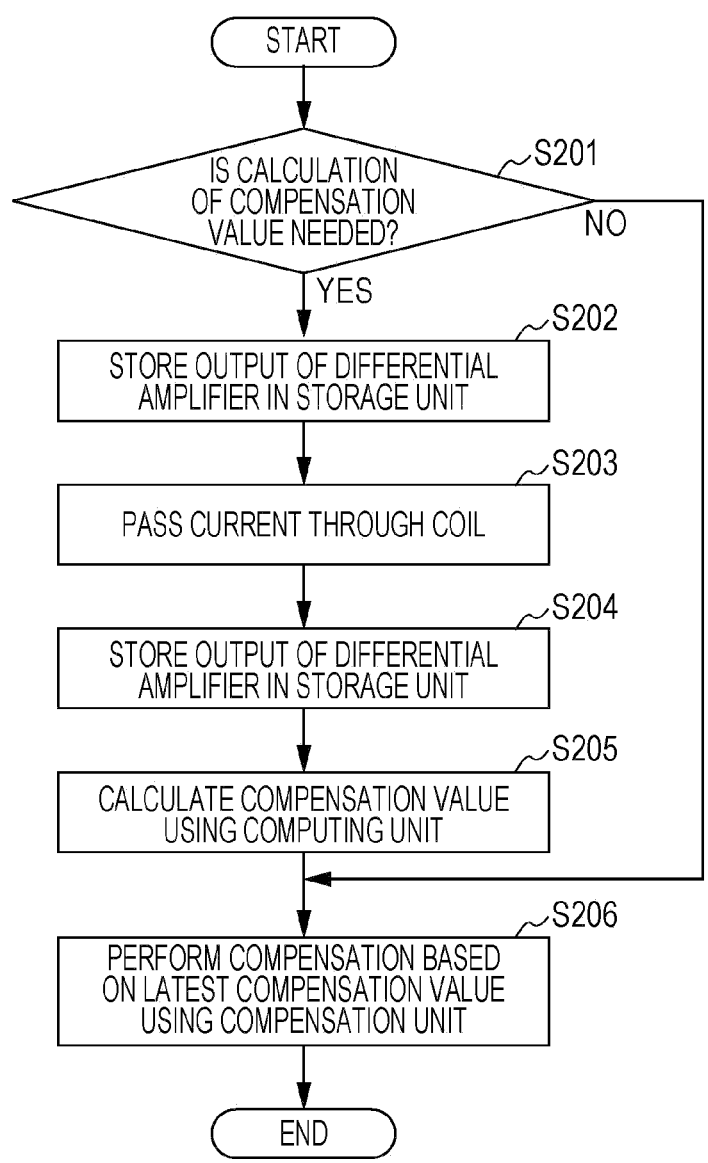
FIG. 7 is a processing flow chart of the current sensor according to the first embodiment.

FIG. 7 is a processing flow chart of the current sensor 1 according to the present embodiment. In the current sensor 1 described above, the control unit 17 first determines whether or not calculation of a compensation value is necessary (step S201). The determination can be performed using a criterion such as whether or not a predetermined time has passed since the previous compensation value calculation, whether or not a device whose current is to be measured has been used for a predetermined time or more, or whether or not the environmental temperature has varied by more than a predetermined amount.

When it is determined that calculation of a compensation value is necessary (Yes in step S201), the control unit 17 instructs the storage unit 14 to store the output of the differential amplifier 13 (step S202). Before the coil 12 generates the induction field Hc, the induction field Hi generated by the measurement current I is applied to the magnetic sensor 11, but the induction field Hc is preferably not yet applied. Hence, an output corresponding to the output characteristic A1 illustrated in FIG. 1 is obtained and stored in the storage unit 14 through the differential amplifier 13.

Then the control unit 17 issues an instruction to pass a current through the coil 12 (step S203). As a result, the induction field Hc is generated by the coil 12. In addition, in this state, the control unit 17 instructs the storage unit 14 to store the output of the differential amplifier 13 (step S204). At the time when a current is passed through the coil 12 and the induction field Hc is generated by the coil 12, the induction field Hi generated by the measurement current I and the induction field Hc are applied to the magnetic sensor 11. Hence, an output corresponding to the output characteristic A2 illustrated in FIG. 1 is obtained and stored in the storage unit 14 through the differential amplifier 13. After the above-described outputs have been obtained, the control unit 17 stops generation of the induction field Hc.

The control unit 17 instructs the computing unit 15 to calculate a compensation value (offset) using the two outputs of the magnetic sensor 11 (step S205). The compensation value can be calculated using Equation (3) as described above. The compensation value calculated by the computing unit 15 is transmitted to the compensation unit 16.

In current measurement after that, the compensation unit 16 compensates the output of the magnetic sensor 11 (output of the differential amplifier 13) using the latest compensation value (step S206) and outputs the compensated result as the output of the current sensor 1. Also in the case where it is determined that calculation of a compensation value is not necessary (No in step S201) such as a case where a predetermined time has not elapsed since the previous compensation value calculation, the compensation unit 16 compensates the output of the magnetic sensor 11 (output of the differential amplifier 13) using the latest compensation value (step S206) and outputs the compensated result as the output of the current sensor 1.

In this manner, the current sensor 1 according to the present embodiment can calculate the offset of the magnetic sensor 11 and perform compensation under the condition that the induction field Hi generated by the measurement current I does not vary. Since processing for calculating a compensation value is finished in a short period of time (several milliseconds or less), the induction field Hi during the processing period negligibly varies when the measurement current I does not markedly vary with time. Hence, a compensation value can be calculated at the time of current measurement. Since a compensation value can be calculated by only changing a current flowing through the coil 12, management of the magnetic field detection sensitivity can be realized using a comparatively simple configuration.

Not limited to the above, the configuration according to the present embodiment can be combined as appropriate with the configurations according to other embodiments in implementation.

Second Embodiment

In the present embodiment, a current sensor that calculates a compensation value using a method that is different from that in the above-described embodiment is described. Since the configuration of the current sensor according to the present embodiment is similar to that of the above-described embodiment, the detailed description thereof is omitted.

Figure 8:
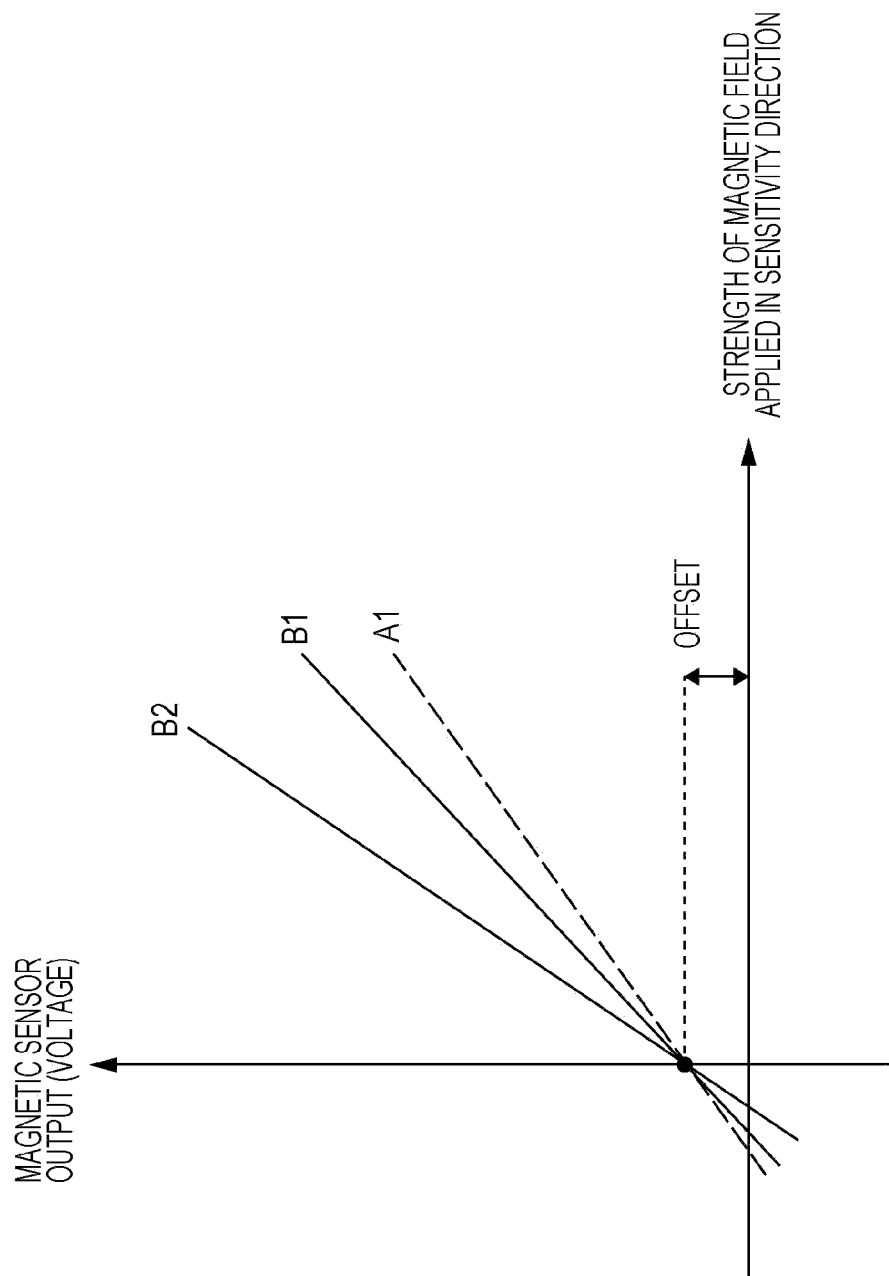
FIG. 8 is an output characteristic diagram of a magnetic sensor in the case where a weak induction field is applied by a coil and the case where a strong induction field is applied by the coil.

The current sensor according to the present embodiment may calculate a compensation value by applying two different induction fields using the coil 12. FIG. 8 is an output characteristic diagram of the magnetic sensor 11 in the case where a weak induction field Hc1 is applied by the coil 12 and the case where a strong induction field Hc2 is applied by the coil 12. In FIG. 8, the output characteristic of the magnetic sensor 11 in the case where the weak induction field Hc1 is applied by the coil 12 is denoted by B1, and the output characteristic of the magnetic sensor 11 in the case where the strong induction field Hc2 is applied by the coil 12 is denoted by B2.

The offset β may be given by Equation (3) also in this case.

$$\beta = (\alpha O1 - O2)/(\alpha - 1) \quad (3)$$

However, in this case, O1 is the output of the magnetic sensor 11 in the case where the weak induction field Hc1 is applied, O2 is the output of the magnetic sensor 11 in the case where the strong induction field Hc2 is applied, and α is the rate of change of sensitivity when the induction field substantially perpendicular to the sensitivity direction S is changed from Hc1 to Hc2.

Figure 9:
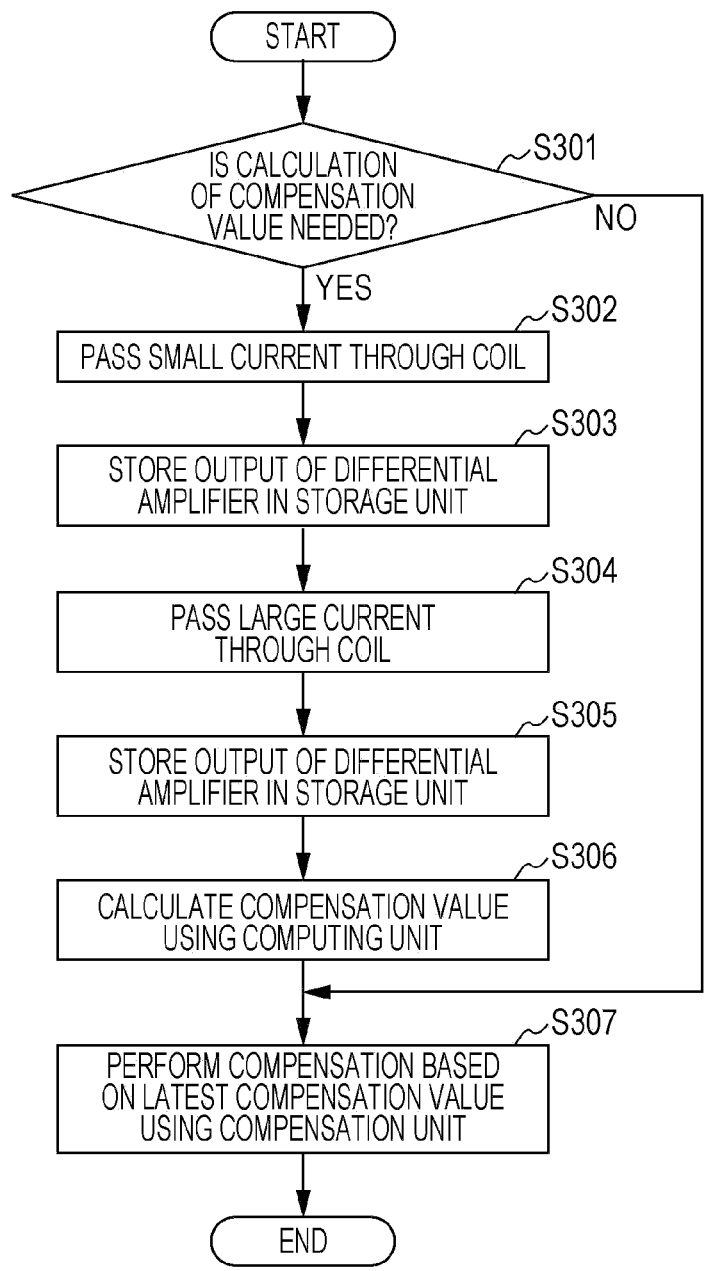
FIG. 9 is a processing flow chart of a current sensor according to a second embodiment.

FIG. 9 is a processing flow chart of the current sensor 1 according to the present embodiment. In the current sensor 1 described above, the control unit 17 first determines whether or not calculation of a compensation value is necessary (step S301). The determination criterion is similar to that of the above-described embodiment.

When it is determined that calculation of a compensation value is necessary (Yes in step S301), the control unit 17 issues an instruction to pass a small current through the coil 12 (step S302). As a result, the weak induction field Hc1 is generated by the coil 12. In this stage, the control unit 17 instructs the storage unit 14 to store the output of the differential amplifier 13 (step S303). At the time when the weak induction field Hc1 is generated by a small current flowing through the coil 12, the induction field Hi generated by the measurement current I and the weak induction field Hc1 are applied to the magnetic sensor 11. Hence, an output corresponding to the output characteristic B1 illustrated in FIG. 9 is output from the magnetic sensor 11 and is stored in the storage unit 14 through the differential amplifier 13.

Then, the control unit 17 issues an instruction to pass a large current through the coil 12 (step S304). As a result, the strong induction field Hc2 is generated by the coil 12. In this stage, the control unit 17 instructs the storage unit 14 to store the output of the differential amplifier 13 (step S305). At the time when the strong induction field Hc2 is generated by a large current flowing through the coil 12, the induction field Hi generated by the measurement current I and the strong induction field Hc2 are applied to the magnetic sensor 11. Hence, an output corresponding to the output characteristic B2 illustrated in FIG. 9 is output from the magnetic sensor 11 and is stored in the storage unit 14 through the differential amplifier 13. After the above-described outputs have been obtained, the control unit 17 stops generation of the induction field Hc2.

The control unit 17 instructs the computing unit 15 to calculate a compensation value (offset) using the two outputs of the magnetic sensor 11 (step S306). The compensation value can be calculated using Equation (3) as described above. The compensation value calculated by the computing unit 15 is transmitted to the compensation unit 16.

In current measurement after that, the compensation unit 16 compensates the output of the magnetic sensor 11 (output of the differential amplifier 13) using the latest compensation value (step S307) and outputs the compensated result as the output of the current sensor 1. Also in the case where it is determined that calculation of a compensation value is not necessary (No in step S301), the compensation unit 16 compensates the output of the magnetic sensor 11 (output of the differential amplifier 13) using the latest compensation value (step S307) and outputs the compensated result as the output of the current sensor 1.

Also in the case where different induction fields are applied by the coil 12 as in the present embodiment, the output of the magnetic sensor 11 can be similarly compensated by calculating a compensation value. Although description has been made in the present invention regarding the case in which the induction fields Hc1 and Hc2 having different strengths and the same direction are applied, induction fields with opposite directions may be applied.

Not limited to the above, the configuration according to the present embodiment can be combined as appropriate with the configurations according to other embodiments in implementation.

As described above, in the current sensor according to the present invention, a compensation value for a magnetic sensor is calculated by applying a magnetic field having a direction perpendicular to the sensitivity direction of a magnetoresistive sensor and, hence, the compensation value can be calculated even during current measurement. As a result, a current sensor is realized that allows appropriate management of magnetic field detection sensitivity to be performed even at the time of current measurement.

The connection relationship, arrangement, and the like of the components in the embodiments described above can be changed within the scope of the present invention. For example, although a configuration in which a computing unit, a compensation unit, and the like are provided within a current sensor has been described in the embodiments described above, these components may be provided outside the current sensor. Further, although a configuration in which a compensation value is calculated using two states with different magnetic fields perpendicular to the sensitivity direction in magnetoresistive sensors has been described in the embodiments described above, a configuration may be used in which a compensation value is calculated on the basis of three or more states. Note that the present invention can be implemented with appropriate modifications within the scope of the invention.

The current sensor of the present invention can be used to detect the magnitude of a motor driving current in electric cars or hybrid cars, for example.

What is claimed is:

1. A current sensor comprising:
    a magnetic sensor including a magnetoresistive sensor having a sensitivity direction, the magnetic sensor detecting an induction field generated by a measurement current passing through a current line and to output a voltage signal corresponding the induction field;
    a magnetic field application unit that applies a magnetic field to the magnetoresistive sensor, the magnetic field having a direction perpendicular to the sensitivity direction of the magnetoresistive sensor; and
    a computing unit that calculates an offset for compensating a sensor output based on at least two voltage signals output from the magnetic sensor under corresponding at least two different states of the magnetic field, the direction of the magnetic field applied to the magnetoresistive sensor from the magnetic field application unit being perpendicular to the sensitivity direction of the magnetoreistive sensor.

2. The current sensor according to claim 1, wherein the at least two different states of the magnetic field includes:
    a first state in which no magnetic field is applied by the magnetic field application unit; and
    a second state in which a predetermined magnetic field is applied by the magnetic field application unit.

3. The current sensor according to claim 1, wherein the at least two different states of the magnetic field includes:
    a first state in which a first magnetic field is applied by the magnetic field application unit; and a second state in which a second magnetic field different from the first magnetic field is applied by the magnetic field application unit.

4. The current sensor according to claim 1, wherein the computing unit calculates the offset $\beta$ as the compensation value from Equation:

$$\beta=(\alpha O_1-O_2)/(\alpha-1)$$

wherein $\alpha$ is a rate of change of sensitivity of the magnetic sensor between the two different states, and $O_1$ and $O_2$ are respective values of the two voltage signals from the magnetic sensor obtained in the two different states.

5. The current sensor according to claim 1, wherein the current sensor calculates an output of the current sensor by subtracting the compensation value from an output of the magnetic sensor.

6. The current sensor according to claim 1, wherein the sensitivity direction is substantially perpendicular to a direction in which the current line extends.

\* \* \* \* \*